US009799696B1

(12) United States Patent
Tai et al.

(10) Patent No.: US 9,799,696 B1
(45) Date of Patent: Oct. 24, 2017

(54) ISOLATION STRUCTURE IN PHOTODIODE

(71) Applicant: OMNIVISION TECHNOLOGIES, INC., Santa Clara, CA (US)

(72) Inventors: Dyson H. Tai, San Jose, CA (US); Duli Mao, Sunnyvale, CA (US); Cunyu Yang, Milpitas, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/293,149

(22) Filed: Oct. 13, 2016

(51) Int. Cl.
*H01L 31/02* (2006.01)
*H01L 31/0264* (2006.01)
*H01L 31/0376* (2006.01)
*H01L 31/18* (2006.01)
*H01L 27/146* (2006.01)

(52) U.S. Cl.
CPC .... *H01L 27/14643* (2013.01); *H01L 27/1461* (2013.01); *H01L 27/1463* (2013.01); *H01L 27/1464* (2013.01); *H01L 27/14612* (2013.01)

(58) Field of Classification Search
CPC ........... H01L 27/14643; H01L 27/1461; H01L 27/14612; H01L 27/1463; H01L 27/1464

USPC ..................................................... 257/228, 75
See application file for complete search history.

(56) References Cited

U.S. PATENT DOCUMENTS

| | | | |
|---|---|---|---|
| 2012/0025199 A1* | 2/2012 | Chen ................ | H01L 27/1464 257/75 |
| 2015/0236058 A1* | 8/2015 | Hu .................... | H01L 27/1463 250/208.1 |

* cited by examiner

*Primary Examiner* — Cuong Q Nguyen
*Assistant Examiner* — Tong-Ho Kim
(74) *Attorney, Agent, or Firm* — Christensen O'connor Johnson Kindness PLLC

(57) ABSTRACT

An image sensor includes a semiconductor material with a photodiode disposed in the semiconductor material. The image sensor also includes a transfer gate electrically coupled to the photodiode to extract image charge from the photodiode in response to a transfer signal. A floating diffusion is electrically coupled to the transfer gate to receive the image charge from the photodiode. At least one isolation structure is disposed in the photodiode, and the at least one isolation structure extends from a surface of the semiconductor material into the photodiode.

20 Claims, 6 Drawing Sheets

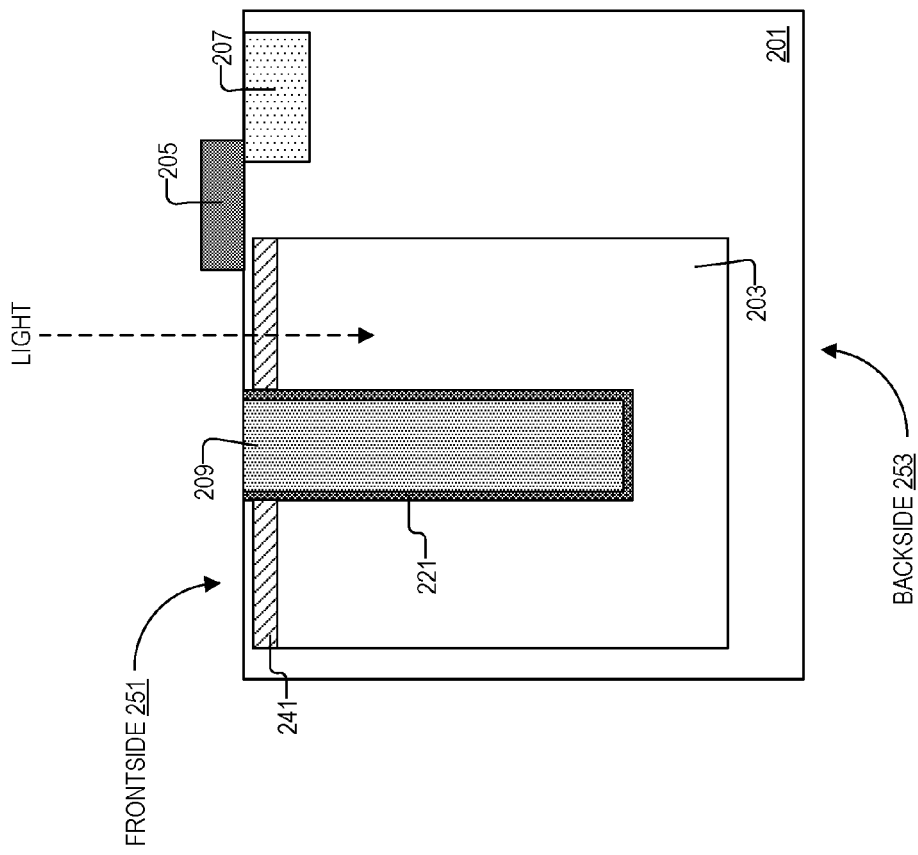
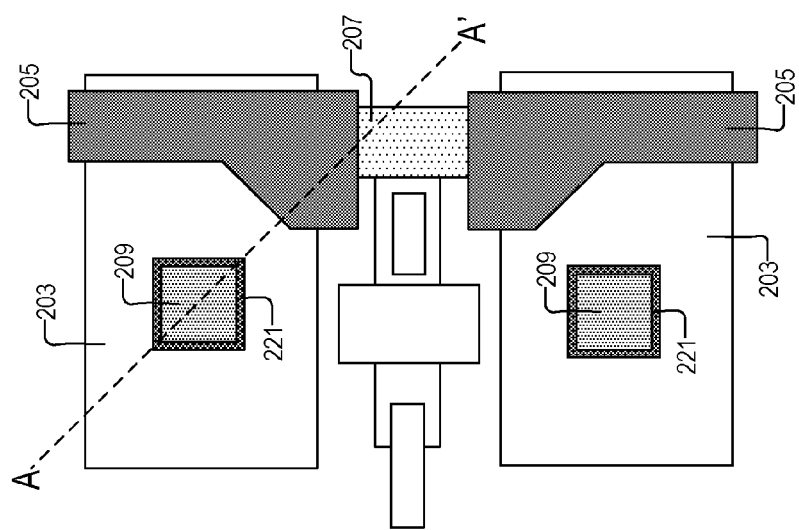
FIG. 2B
FIG. 2A

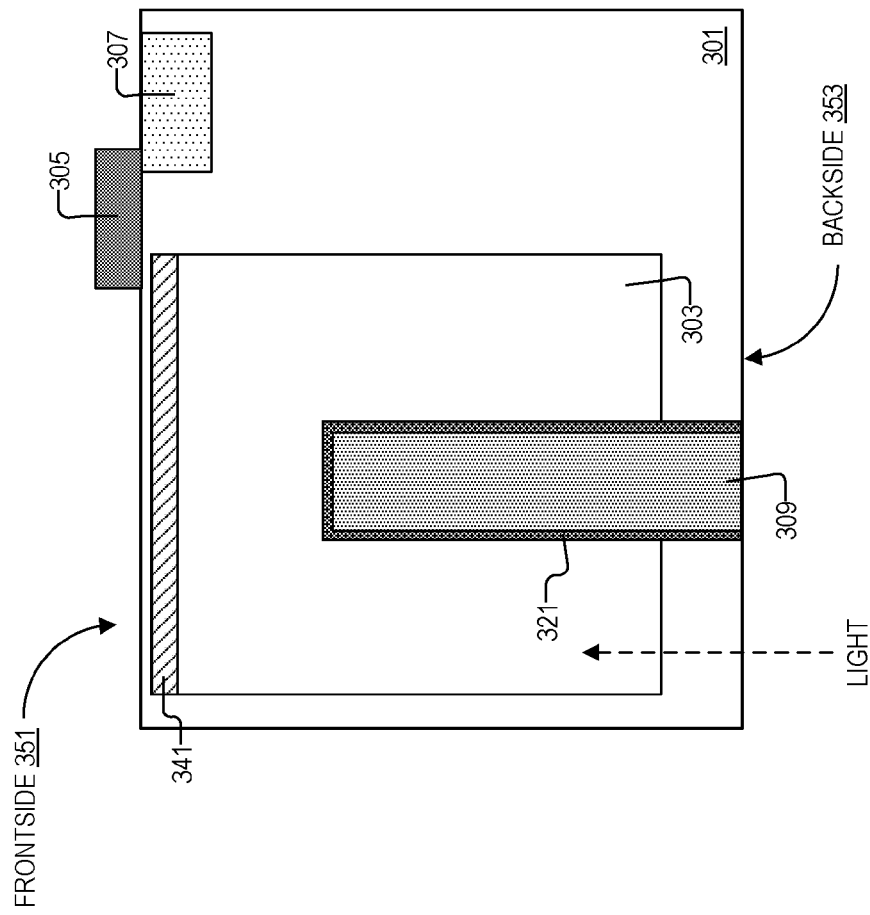
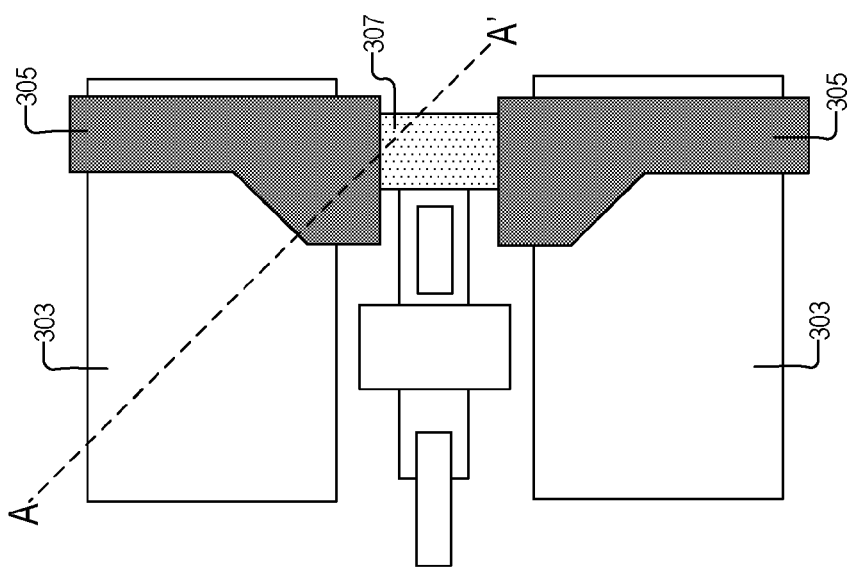
FIG. 3B
FIG. 3A

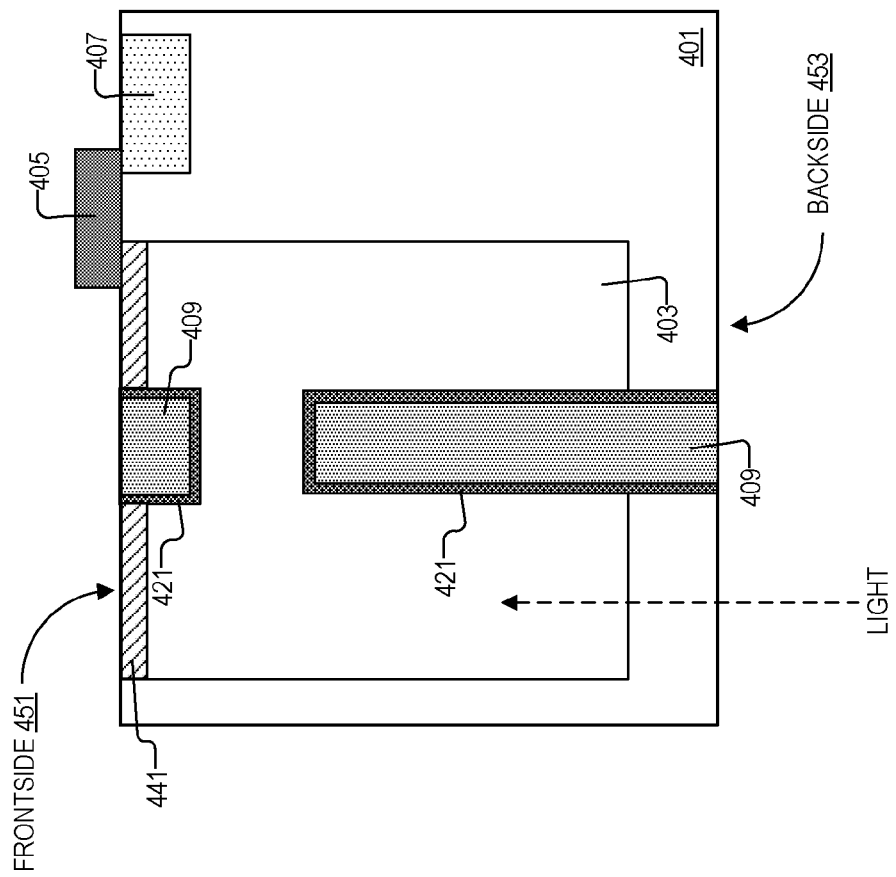
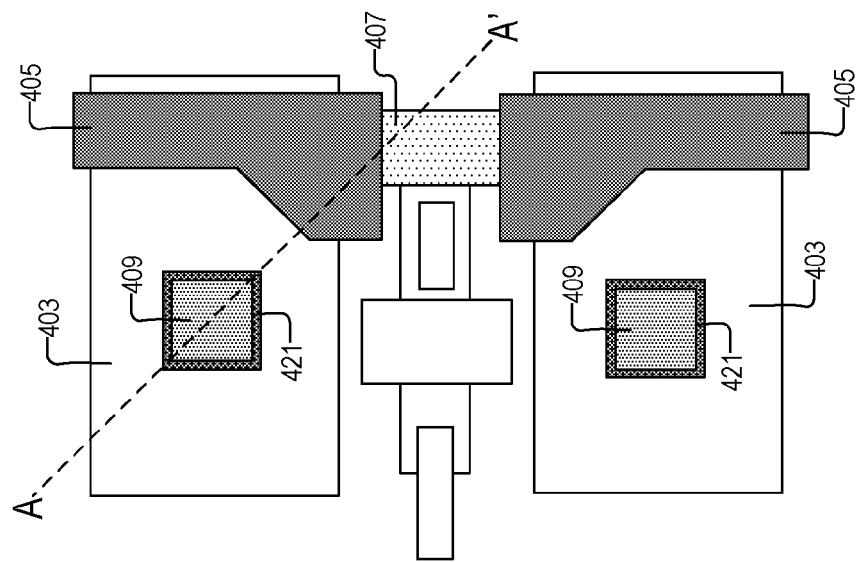
FIG. 4A
FIG. 4B

ISOLATION STRUCTURE IN PHOTODIODE

TECHNICAL FIELD

This disclosure relates generally to semiconductor fabrication, and in particular but not exclusively, relates to photodiode lag reduction.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

In some situations, it is difficult to construct a photodiode pixel circuitry that completely resets the photodiode in the low voltage environment that most modern image sensors operate in. Image lag is residual information (image charge) left in a photodiode after the photodiode has been read-out and reset. For example, when the sensor is moving between image frames, image lag may result in ghost images (images of previously captured scenes) in the most recent image output by the image sensor. This is not desirable as ghost images degrade image quality and may confuse machines analyzing the images.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIG. 2A is a top down illustration of two photodiodes in an image sensor, in accordance with the teachings of the present invention.

FIG. 2B is a cross sectional illustration of a photodiode from FIG. 2A as cut along line A-A', in accordance with the teachings of the present invention.

FIG. 3A is a top down illustration of two photodiodes in an image sensor, in accordance with the teachings of the present invention.

FIG. 3B is a cross sectional illustration of a photodiode from FIG. 3A as cut along line A-A', in accordance with the teachings of the present invention.

FIG. 4A is a top down illustration of two photodiodes in an image sensor, in accordance with the teachings of the present invention.

FIG. 4B is a cross sectional illustration of a photodiode from FIG. 4A as cut along line A-A', in accordance with the teachings of the present invention.

Figure 1B:
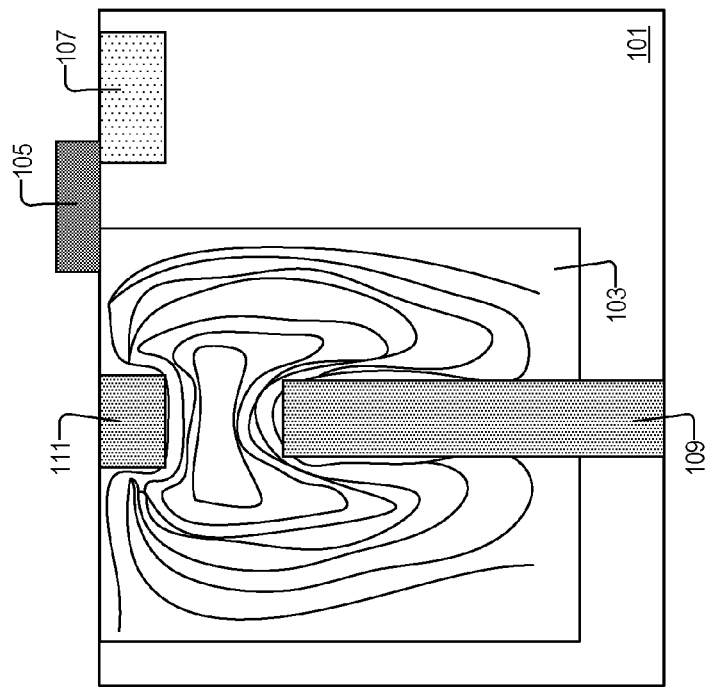
FIG. 1B is a cross sectional illustration of an example photodiode in an image sensor, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus for isolation structures in photodiodes are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 1A:
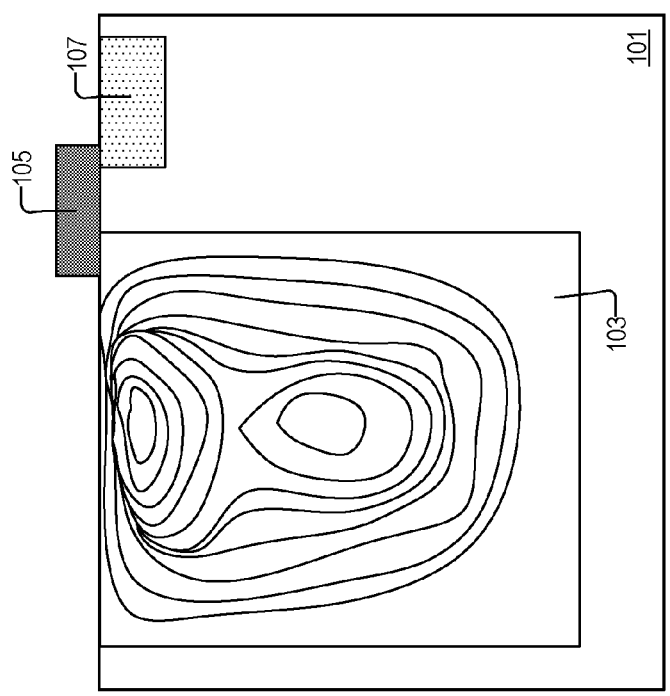
FIG. 1A is a cross sectional illustration of an example photodiode in an image sensor.

FIG. 1A is a cross sectional illustration of an example photodiode 103 in an image sensor. Also depicted are transfer gate 105 and floating diffusion 107. The electric field lines resulting from the fabrication of photodiode 103 are shown in photodiode 103. Dopant was likely implanted (by ion beam or the like) into semiconductor material 101 to form photodiode 103. As illustrated by the electric field lines, there are several areas where charge may be trapped within photodiode 103. Charge may remain trapped even after a transfer signal has been applied to transfer gate 105. This may result in image lag/ghost images which degrade the final image quality.

Conversely, FIG. 1B is a cross sectional illustration of an example photodiode 103 which has isolation structures 109 (deep) and 111 (shallow) formed within it, in accordance with the teachings of the present disclosure. These isolation structures alter the electric field lines in photodiode 103. Accordingly, the areas in photodiode 103 that trapped image charge in FIG. 1A are removed from FIG. 1B. Moreover, the highest energy point in photodiode 103 is moved toward the entrance of transfer gate 105, reducing the voltage needed to extract image charge. Thus photodiode 103 in FIG. 1B has less image lag than a conventional photodiode.

FIG. 2A is a top down illustration of two photodiodes 203 in an image sensor. The image sensor also includes transfer gates 205, floating diffusion 207, and an isolation structure (including core material 209 and liner material 221 in each photodiode 203). As depicted, the isolation structures are laterally disposed proximate to the center of photodiodes 203. In other words, the isolation structure is not in contact with the edges of photodiode 203. Although in the depicted example the isolation structure is a square column, in other examples the isolation structure may take other shapes such as a circular column, hexagonal column, or the like.

FIG. 2B is a cross sectional illustration of a photodiode 203 from FIG. 2A as cut along line A-A'. As shown, photodiode 203 is disposed in semiconductor material 201 to receive light through frontside 251 of semiconductor material 201, and transfer gate 205 is electrically coupled to photodiode 203 to extract image charge from photodiode 203 in response to a transfer signal applied to transfer gate 205. Floating diffusion 207 is electrically coupled to transfer gate 205 to receive the image charge from photodiode 203. In the depicted example, one isolation structure is disposed in photodiode 203, and the isolation structure extends from frontside 251 surface of semiconductor material 201, through pinning well 241, and into photodiode 203. In the depicted example, the isolation structure includes liner material 221 and core material 209, and liner material 221 is disposed between photodiode 203 and core material 209. However, in other examples, liner material 221 may not be present and/or liner material 221 may be the same as core material 209. Liner material 221 may include at least one of a high k-oxide or a doped semiconductor material. For example, a trench could be etched and boron, nitrogen, or arsenic could be implanted into the sidewalls of the trench to form doped semiconductor as liner material 221. Alternatively a trench could be etched and hafnium oxide could be deposited in the trench to form a high-k liner material 221. Core material 209 may include an oxide, nitride, semiconductor material, metal or the like. It is worth noting that one additional advantage of the isolation structures (other than image lag reduction) is that they can be formed without additional process steps—utilizing masking and etching processes that form other pieces of device architecture to form the isolation structure. This makes the isolation structures a cost effective way to mitigate image lag.

In one example, the isolation structure induces a charge in semiconductor material 201 at an interface of the at least one isolation structure and photodiode 203. In one example, the charge is opposite a majority charge carrier type of a bulk (e.g., the majority of the doped region that forms photodiode 203) of photodiode 203. For example, the bulk of photodiode 203 may be n-type and the isolation structure induces hole buildup at the interface of the isolation structure and semiconductor material 201. Alternatively the bulk of photodiode 203 may be p-type and the isolation structure induces electron buildup at the interface of the isolation structure and semiconductor material 201.

FIG. 3A is a top down illustration of two photodiodes 303 in an image sensor. As shown in the depicted example there are no isolation structures disposed in frontside 351 of photodiodes 303.

FIG. 3B is a cross sectional illustration of a photodiode 303 from FIG. 3A as cut along line A-A'. As illustrated, image light is incident on backside 353 of the image sensor and isolation structure extends from backside 353 of semiconductor material 301 into photodiode 303. In the depicted example, the isolation structure extends more than halfway through semiconductor material 301 into photodiode 303. But it should be noted that the isolation structure does not reach pinning well 341. Moreover, the image sensor depicted is a backside illuminated image sensor because, as one skilled in the art will appreciate, the side of the image sensor with the circuitry (e.g., transfer gate 305 and floating diffusion 307) designates the frontside 351.

In the illustrated example, semiconductor material 301 is silicon. However, one skilled in the art will appreciate that any group III elements (B, Al, Ga, In, Tl), group IV elements (C, Si, Ge, Sn, Pb), group V elements (N, P, As, Sb, Bi), and suitable combinations of these elements, may be used to form semiconductor material 301, in accordance with the teachings of the present invention. Moreover, isolation structures may include a number of semiconductor elements and dopants. In some examples, isolation structures may also include oxides/nitrides such as silicon oxide ($SiO_2$), hafnium oxide ($HfO_2$), silicon nitride ($Si_3N_4$), silicon oxynitirde ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or the like. Additionally, one skilled in the relevant art, will recognize that any stoichiometric combination of the above metals/semiconductors and their oxides/nitrides/oxynitrides may be used, in accordance with the teachings of the present invention.

FIG. 4A is a top down illustration of two photodiodes 403 in an image sensor, in accordance with the teachings of the present invention. The image sensor also includes transfer gates 405, floating diffusion 407, and isolation structures (including core material 409 and liner material 421). As depicted, the isolation structure is laterally disposed proximate to the center of photodiode 403.

FIG. 4B is a cross sectional illustration of a photodiode 403 from FIG. 4A as cut along line A-A'. In the illustrated example image light is incident on backside 453 of the image sensor, and at least one isolation structure extends from backside 453 of semiconductor material 401 into photodiode 403. A second isolation structure extends from frontside 451 of semiconductor material 401, through pinning well 441, and into photodiode 403. In the depicted example the isolation structure only extends a short distance into photodiode 403 (e.g., 25% or less of the thickness of semiconductor material 401). The second isolation structure is aligned with the isolation structure disposed proximate to backside 453. In one example, a portion of photodiode 403 is disposed between the second isolation structure disposed in frontside 451 and the isolation structure disposed in backside 453. This configuration may form the electric field lines depicted in FIG. 1B. As illustrated the cross sectional area of the isolation structure entering photodiode 403 from backside 453 is larger than the cross sectional area of isolation structure entering photodiode 403 from frontside 451. However, in other examples, they may have the same cross sectional area, or the isolation structure entering photodiode 403 from frontside 451 may have a larger cross sectional area than the isolation structure entering from backside 453.

Figure 5:
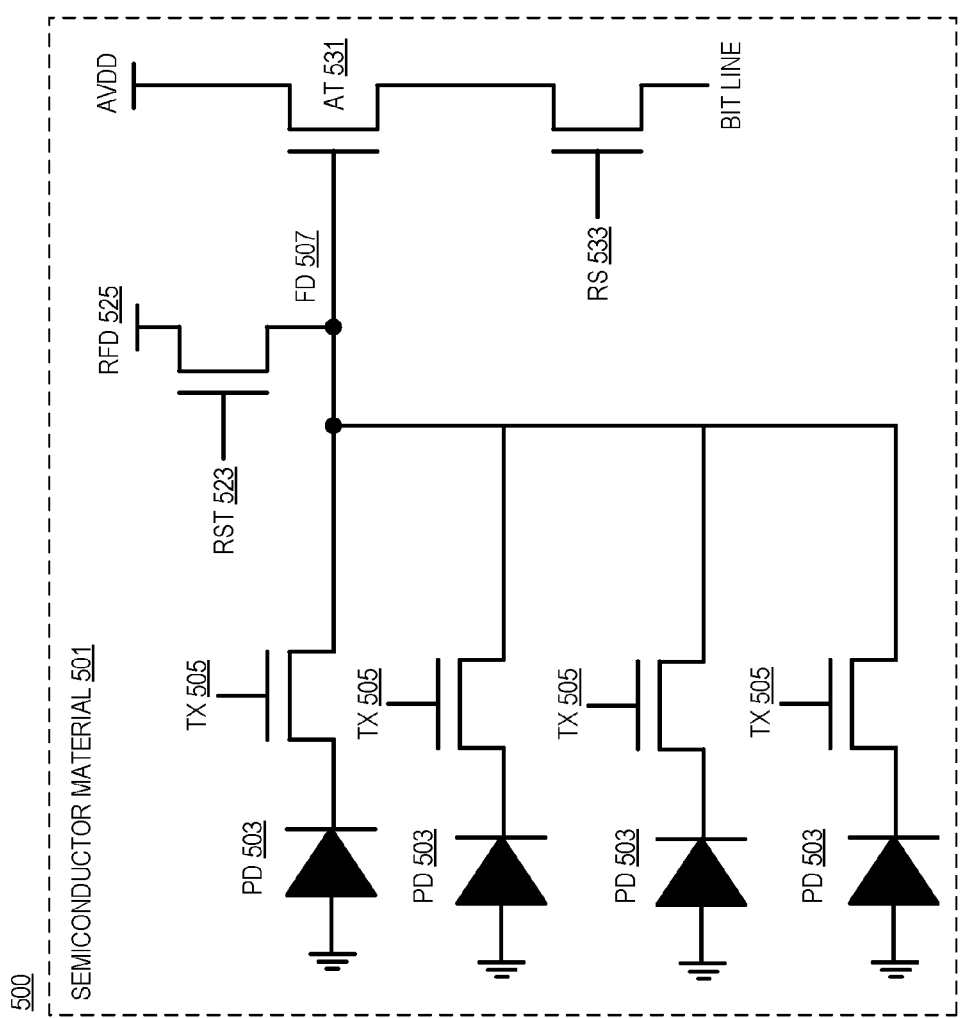
FIG. 5 illustrates an example circuit diagram which may include the photodiodes in FIGS. 2A-4B, in accordance with the teachings of the present invention.

FIG. 5 illustrates an example circuit diagram 500 which may include the photodiodes in FIGS. 2A-4B. In the depicted example, circuit diagram 500 includes semiconductor material 501, plurality of photodiodes 503, plurality of transfer gates 505, floating diffusion 507, reset transistor 523, amplifier transistor 531, and row select transistor 533. Plurality of photodiodes 503 is disposed in semiconductor material 501 to accumulate image charge in response to incident light directed into plurality of photodiodes 503. Plurality of transfer gates 505 is also disposed in semiconductor material 501 and individual transfer gates 505 in plurality of transfer gates 505 are coupled to individual photodiodes 503 in plurality of photodiodes 503. Floating diffusion 507 is disposed in semiconductor material 501, and floating diffusion 507 is coupled to the plurality of transfer gates 505 to receive image charge from plurality of photodiodes 503 in response to a transfer signal sequentially applied to a control terminal of each individual transfer gate 505. In other words, in the depicted example, a transfer signal is applied to the control terminal of the top transfer gate 505, then a transfer signal is applied to the control terminal of the second-from-the-top transfer gate 505, etc. Reset transistor 523 is coupled to floating diffusion 507 to extract the image charge from floating diffusion 507. Further, amplifier transistor 531 is coupled to floating diffusion 507 to amplify image charge on floating diffusion 507, and row select transistor 533 is coupled between an output of amplifier transistor 531 and a bit line output. In one example, amplifier transistor 531 includes a source follower coupled transistor.

As shown in FIGS. 2A-4B, elements of readout circuitry may be disposed proximate to the non-illuminated surface of semiconductor material 501 or proximate to the illuminated surface of semiconductor material 501. In other words, transfer gates 505 are disposed on the frontside of the device which may or may not be illuminated depending on if the image sensor is a frontside or backside illuminated sensor.

In the depicted example, plurality of photodiodes 503 includes four photodiodes 503 coupled to floating diffusion 507 through transfer gates 505. However, in a different example, any number of photodiodes 503 may be coupled to floating diffusion 507 including two, six, and eight photodiodes 503. In the depicted example, the four photodiodes 503 include two photodiodes 503 disposed to absorb green light, one photodiode 503 disposed to absorb blue light, and one photodiode 503 disposed to absorb red light. However, in other examples photodiodes 503 may absorb other wavelengths of light such as infrared or the like. Although not depicted in FIG. 5, color selection may be accomplished by placing a color filter layer proximate to semiconductor material 501. In one example, the color filter layer includes red, infrared, green, and blue color filters which may be arranged into a Bayer pattern, EXR pattern, X-trans pattern, or the like. However, in a different or the same example, the color filter layer may include infrared filters, ultraviolet filters, or other light filters that isolate invisible portions of the EM spectrum. In the same or a different example, a microlens layer is formed on the color filter layer. The microlens layer may be fabricated from a photo-active polymer that is patterned on the surface of the color filter layer. Once rectangular blocks of polymer are patterned on the surface of the color filter layer, the blocks may be melted (or reflowed) to form the dome-like structure characteristic of microlenses.

Figure 6:
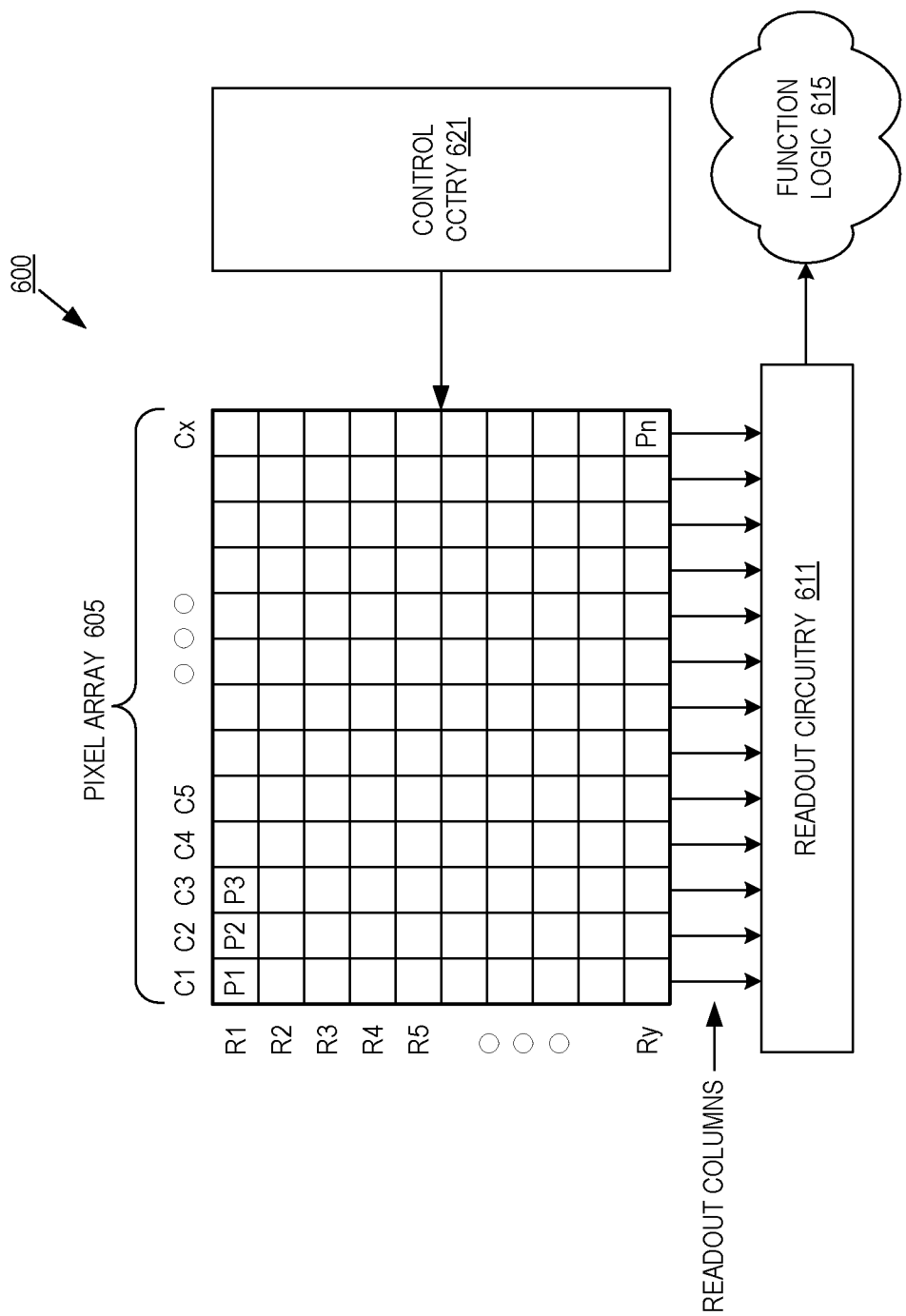
FIG. 6 is a block diagram of an imaging system which may include the photodiodes in FIGS. 2A-4B, in accordance with the teachings of the present invention.

FIG. 6 is a block diagram of an imaging system which may include the photodiodes in FIGS. 2A-4B. Imaging system 600 includes pixel array 605, control circuitry 621, readout circuitry 611, and function logic 615. In one example, pixel array 605 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 605 has acquired its image data or image charge, the image data is readout by readout circuitry 611 and then transferred to function logic 615. In various examples, readout circuitry 611 may include amplification circuitry, analog-to-digital (ADC) conversion circuitry, or otherwise. Function logic 615 may simply store the image data or even manipulate the image data by applying post image effects (e.g., crop, rotate, remove red eye, adjust brightness, adjust contrast, or otherwise). In one example, readout circuitry 611 may readout a row of image data at a time along readout column lines (illustrated) or may readout the image data using a variety of other techniques (not illustrated), such as a serial readout or a full parallel readout of all pixels simultaneously.

In one example, control circuitry 621 is coupled to pixel array 605 to control operation of the plurality of photodiodes in pixel array 605. For example, control circuitry 621 may generate a shutter signal for controlling image acquisition. In one example, the shutter signal is a global shutter signal for simultaneously enabling all pixels within pixel array 605 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects such as a flash.

In one example, imaging system 600 may be included in a digital camera, cell phone, laptop computer, automobile or the like. Additionally, imaging system 600 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 600, extract image data from imaging system 600, or manipulate image data supplied by imaging system 600.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor, comprising:
 a semiconductor material including a photodiode disposed in the semiconductor material;
 a transfer gate electrically coupled to the photodiode to extract image charge from the photodiode in response to a transfer signal;
 a floating diffusion electrically coupled to the transfer gate to receive the image charge from the photodiode; and
 at least one isolation structure disposed in the photodiode, wherein the at least one isolation structure extends from a surface of the semiconductor material into the photodiode, and wherein the at least one isolation structure is vertically disposed proximate to a center of the photodiode.

2. The image sensor of claim 1, wherein the at least one isolation structure includes a liner material and a core material, and wherein the liner material is disposed between the photodiode and the core material.

3. The image sensor of claim 2, wherein the isolation structure induces a charge in the semiconductor material at an interface of the at least one isolation structure and the photodiode, and wherein the charge is opposite a majority charge carrier type of a bulk of the photodiode.

4. The image sensor of claim 3, wherein the liner material includes at least one of a high k-oxide or a doped semiconductor material.

5. The image sensor of claim 1, wherein image light is incident on a backside of the image sensor, and wherein the at least one isolation structure extends from the backside of the semiconductor material into the photodiode.

6. The image sensor of claim 5, further comprising a second isolation structure that extends from a frontside of the semiconductor material into the photodiode, and wherein the second isolation structure is aligned with the at least one isolation structure, and wherein a portion of the photodiode is disposed between the second isolation structure and the at least one isolation structure.

7. The image sensor of claim 6, wherein the second isolation structure has a smaller cross sectional area than the at least one isolation structure.

8. The image sensor of claim 1, wherein image light is incident on a frontside of the image sensor, and wherein the at least one isolation structure extends from the frontside of the semiconductor material into the photodiode.

9. The image sensor of claim 1, wherein the at least one individual isolation structure is disposed in the photodiode to position a highest energy point in the photodiode proximate to the transfer gate to reduce a voltage needed to extract the image charge from the photodiode in response to the transfer signal.

10. The image sensor of claim 1, wherein the at least one individual isolation structure is substantially columnar and laterally surrounded by the photodiode.

11. An imaging system, comprising:
a plurality of photodiodes disposed in a semiconductor material, wherein the semiconductor material has a frontside and a backside opposite the frontside;
a plurality of transfer gates to transfer image charge from the plurality of photodiodes to one or more floating diffusions; and
a plurality of isolation structures, wherein at least one individual isolation structure in the plurality of isolation structures is disposed in an individual photodiode in the plurality of photodiodes, wherein the at least one individual isolation structure is vertically disposed proximate to a center of the individual photodiode, and wherein the at least one individual isolation structure includes:
a core material extending from a surface of the semiconductor material into the semiconductor material a first depth; and
a lining material disposed between the core material and the semiconductor material, wherein an interface between the semiconductor material and the lining material is charged.

12. The imaging system of claim 11, wherein a charge at the interface has an opposite sign as a majority charge carrier type of a largest doped region of the individual photodiode.

13. The imaging system of claim 11, wherein image light is incident on the backside of the semiconductor material, and wherein the plurality of isolation structures extends from the backside of the semiconductor material into the semiconductor material.

14. The imaging system of claim 13, wherein a second isolation structure in the plurality of isolation structures extends from the frontside of the semiconductor material into the semiconductor material, and wherein a portion of the photodiode extends between the second isolation structure and the at least one individual isolation structure.

15. The imaging system of claim 14, wherein the second isolation structure extends through a pinning well disposed proximate to the frontside of the semiconductor material.

16. The imaging system of claim 14, wherein a cross sectional area of the second isolation structure is less than a cross sectional area of the at least one individual isolation structure.

17. The imaging system of claim 11, wherein image light is incident on the frontside of the semiconductor material, and wherein the plurality of isolation structures extends from the frontside of the semiconductor material into the semiconductor material.

18. The imaging system of claim 17, wherein the plurality of isolation structures extends through a plurality of pinning wells disposed proximate to the frontside of the semiconductor material.

19. The imaging system of claim 11, further comprising:
a reset transistor electrically coupled to the one or more floating diffusions to extract image charge from the one or more floating diffusions;
an amplifier transistor coupled to the one or more floating diffusions to amplify the image charge on the one or more floating diffusions; and
a row select transistor electrically coupled to the amplifier transistor.

20. The imaging system of claim 11, wherein the first depth is less than a thickness of the semiconductor material.

* * * * *